(12) United States Patent
Horikawa et al.

(10) Patent No.: US 7,897,921 B2
(45) Date of Patent: Mar. 1, 2011

(54) PYROELECTRIC CERAMIC COMPOSITION, AND INFRARED ELEMENT, AND INFRARED DETECTOR

(75) Inventors: Katsuhiro Horikawa, Toyama (JP); Koji Hayashi, Kyoto (JP); Hideki Ishii, Higashiomi (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 192 days.

(21) Appl. No.: 12/251,197

(22) Filed: Oct. 14, 2008

(65) Prior Publication Data

US 2010/0044568 A1    Feb. 25, 2010

Related U.S. Application Data

(63) Continuation of application No. PCT/JP2007/052349, filed on Feb. 9, 2007.

(30) Foreign Application Priority Data

Apr. 28, 2006    (JP) .............................. 2006-126938

(51) Int. Cl.
G01J 5/00    (2006.01)
(52) U.S. Cl. .................................. 250/338.3; 250/338.1
(58) Field of Classification Search .............. 250/338.3, 250/338.1
See application file for complete search history.

(56) References Cited

U.S. PATENT DOCUMENTS

| | | | | |
|---|---|---|---|---|
| 5,440,125 A | * | 8/1995 | Hennins et al. ........... | 250/338.1 |
| 6,104,128 A | * | 8/2000 | Fujii et al. ................. | 310/358 |
| 6,329,656 B1 | | 12/2001 | Whatmore | |
| 6,734,606 B2 | * | 5/2004 | Kimura et al. ............. | 310/358 |
| 2005/0115039 A1 | * | 6/2005 | Okuda et al. ............... | 29/25.35 |

(Continued)

FOREIGN PATENT DOCUMENTS

JP    57-035388 A    2/1982

(Continued)

OTHER PUBLICATIONS

Futakuchi et al.,"Preparation of PbTiO3 Thin Film by Screen Printing Method", Dec. 1994, Jpn. J. Appl. Phys. vol. 33 pp. 6626-6629.*

(Continued)

*Primary Examiner*—David P Porta
*Assistant Examiner*—Mindy Vu
(74) *Attorney, Agent, or Firm*—Dickstein Shapiro LLP

(57) ABSTRACT

A pyroelectric ceramic composition contains a compound represented by $(Pb_{1-x}Ca_x)_{(1+a)}\{(Ni_{1/3}Nb_{2/3})_y Ti_{(1-y)}\}O_3$ (wherein x, y, and a satisfy $0.20 \leq x \leq 0.27$, $0.01 \leq y \leq 0.06$, and $0.001 \leq a \leq 0.02$, respectively) as a main component and 0.3 to 2.5 mol of Mn per 100 mol of the main component. The amount of segregates containing Ni, Ti, and Mn is 1.0 vol % or less (including 0 vol %) of a fired sinter. A pyroelectric ceramic composition that has an adequately low insulation resistance and a high Curie temperature while achieving satisfactory pyroelectric properties is realized. Since the composition has a high Curie temperature, a thin, small pyroelectric element that withstands a reflow process can be obtained. Since the composition has a low insulation resistance, an infrared detector incorporating a pyroelectric element composed of the composition does not require a load resistance to be provided in parallel to the pyroelectric element and size reduction is possible.

20 Claims, 3 Drawing Sheets

U.S. PATENT DOCUMENTS

2006/0006360 A1* 1/2006 Takao et al. ............. 252/62.9 R

FOREIGN PATENT DOCUMENTS

| JP | 60-191054 A | 9/1985 |
| JP | 63319241 | 12/1988 |
| JP | 1261876 | 10/1989 |
| JP | 2246274 | 10/1990 |
| JP | 558645 | 3/1993 |
| JP | 6252468 | 9/1994 |
| JP | 9159524 | 6/1997 |
| JP | 2000-077833 A | 3/2000 |
| JP | 2003119075 | 4/2003 |
| JP | 2004161519 A | 6/2004 |

OTHER PUBLICATIONS

Written Opinion of the International Searching Authority for PCT/JP2007/052349 dated May 15, 2007.

C.P. Shaw et al.; "Pyroelectric properties of Mn-doped lead zirconate-lead titanate-lead magnesium niobate ceramics"; Journal of the European Ceramic Society, vol. 22, No. 13, Dec. 2002, pp. 2123-2132.

Database CA [Online]; Chemical Abstracts Service, Columbus, OH, US; Jul. 26, 1996, Chen, Zhongju et al.; "Preparation and characterization of $Pb_{0.75}Ca_{0.25}[Ni_{1/3}Nb_{2/3})_{0.08}Ti_{0.912}Mn_{0.008}]O_3$ ultrafine powder"; XP-002554878, retrieved from STN Database accession No. 1996. 442792, abstract.

\* cited by examiner

PYROELECTRIC CERAMIC COMPOSITION, AND INFRARED ELEMENT, AND INFRARED DETECTOR

This is a continuation of application Ser. No. PCT/JP2007/052349, filed Feb. 9, 2007.

TECHNICAL FIELD

The present invention relates to a pyroelectric ceramic composition, a pyroelectric element composed of the pyroelectric ceramic composition, and an infrared detector including the pyroelectric element.

BACKGROUND ART

When pyroelectric ceramic compositions absorb infrared radiation energy and undergo changes in temperature, charges are formed on surfaces by changes in the spontaneous polarization. Pyroelectric ceramic compositions are widely used in pyroelectric bodies for pyroelectric elements by utilizing this property and are applied to infrared detectors.

This type of pyroelectric ceramic compositions is required to have a high pyroelectric property, i.e., required to change the spontaneous polarization with changes in temperature of pyroelectric bodies. Moreover, a pyroelectric body having an excessively low relative dielectric constant is easily affected by stray capacitance of an external circuit of an infrared detector and thus generates large noise. In contrast, a pyroelectric body having an excessively high relative dielectric constant has decreased detectivity since surface charges (pyroelectric charges) generated on the surface of a pyroelectric element are accumulated in the element itself. Thus, the pyroelectric ceramic composition is required to have an adequate level of relative dielectric constant.

For example, Patent Document 1 proposes use of a pyroelectric ceramic composition in the pyroelectric element, the composition containing a lead titanate (PT) compound represented by general formula: $(Pb_{1-x}Ca_x)\{(Ni_{1/3}Nb_{2/3})_y Ti_{1-y}\}O_3$ (wherein x and y satisfy $0.25 \leq x \leq 0.35$ and $0.01 \leq y \leq 0.06$) as the main component and 0.3 to 2.5 at % Mn as an auxiliary component.

In Patent Document 1, part of Pb, which is an A site component of a perovskite crystal structure (general formula: $ABO_3$), is replaced with Ca in the range of 25 to 35 mol % so as to achieve a target optimum relative dielectric constant. Moreover, in Patent Document 1, part of Ti, which is a B site component, is replaced with $(Ni_{1/3}Nb_{2/3})$ to improve the pyroelectric property, and a particular amount of Mn as the auxiliary component is contained to improve the sinterability.

Patent Document 1: Japanese Unexamined Patent Application Publication No. 1-261876

DISCLOSURE OF INVENTION

Problems to be Solved by the Invention

Since the pyroelectric ceramic composition of Patent Document 1 has a high insulation resistance, the pyroelectric current output from the pyroelectric element is small, and stable sensor properties with changes in temperature have not been obtained in the case where a pyroelectric element containing the pyroelectric ceramic composition is used in an infrared detector.

This is described specifically by referring to a basic circuit diagram of a conventional infrared detector shown in FIG. 5.

In the conventional infrared detector the magnitude of polarization of the pyroelectric element 102 changes as infrared radiation from a subject such as human body enters a pyroelectric element 102 according to the amount of infrared radiation and a pyroelectric current having a magnitude proportional to the magnitude of the polarization is output. This pyroelectric current is converted into voltage by impedance conversion via a load resistance 101, and a voltage signal corresponding to the pyroelectric current is input to a gate terminal 104 of a field effect transistor (hereinafter referred to as "FET) 103. A supply voltage is applied to a drain terminal 105 of the FET 103 and a source terminal 106 and a ground terminal 107 are interconnected via a source resistor (not shown). A bias voltage potentially divided with the resistance between the drain terminal 105 and the source terminal 106 and the source resistor (not shown) is superimposed on the voltage signal input to the gate terminal 104 so that a voltage signal is output from the source terminal 106.

However, the insulation resistance of the pyroelectric element 102 in the infrared detector of Patent Document 1 is high and thus the pyroelectric current output from the pyroelectric element 102 is small. As a result, the bias voltage Vs fluctuates greatly with changes in temperature in detecting the bias voltage Vs output from the source terminal 106.

Thus, in the conventional infrared detector, a load resistance 101 is provided in parallel to the pyroelectric element 102 to increase the pyroelectric current output from the pyroelectric element 102. In this manner, the fluctuation of the bias voltage Vs with changes in temperature can be decreased and stable sensor properties are achieved. In other words, the conventional infrared detector requires the load resistance 101 and this has increased the size of the infrared detector.

Furthermore, a further reduction in size and thickness of infrared detectors has been desired in recent years and infrared detectors suitable for surface mounting are desired. Such surface-mount type infrared detectors are preferably mounted on a substrate by a reflow process and thus are required to have a high Curie temperature Tc that can withstand the high-temperature heat treatment during the reflow process.

On the other hand, Patent Document 1 describes that when part of Pb, which is an A site component of a perovskite crystal structure (general formula: $ABO_3$), is replaced with Ca in the range of 25 to 35 mol %, a high Curie temperature Tc (e.g., 260° C. or more) that can withstand the reflow process can be obtained.

However, when a pyroelectric element composed of the pyroelectric ceramic composition of Patent Document 1 is mounted on a substrate by a reflow process, there has been a problem of degradation of the pyroelectric property. Thus, under current situation, a surface-mount type infrared detector that can be mounted on a substrate by a reflow process has not been realized yet.

The present invention has been made under these circumstances and aims to provide a pyroelectric ceramic composition that has an adequately low insulation resistance and a high Curie temperature while achieving satisfactory pyroelectric properties, a pyroelectric element containing the pyroelectric ceramic composition, and an infrared detector including the pyroelectric element.

Means for Solving the Problems

The inventors of the present invention have conducted extensive studies to overcome the problems and have found that by increasing the molar content ratio of the A site component of a lead titanate compound having a perovskite crystal structure (general formula $ABO_3$) from the stoichiometric composition by a particular amount so that the A site component is in excess and by incorporating a certain amount of Mn component, a pyroelectric ceramic composition that has an adequately low insulation resistance and a high Curie temperature Tc (e.g., 260° C. or more) that can withstand the reflow process while achieving satisfactory pyroelectric properties can be obtained.

The present invention has been made on the basis of these findings. A pyroelectric ceramic of the present invention includes a compound represented by $(Pb_{1-x}Ca_x)_{(1+a)}\{(Ni_{1/3}Nb_{2/3})_y Ti_{(1-y)}\}O_3$ (wherein x, y, and a satisfy $0.20 \leq x \leq 0.27$, $0.01 \leq y \leq 0.06$, and $0.001 \leq a \leq 0.02$) as a main component and 0.3 to 2.5 mol of Mn per 100 mol of the main component.

The inventors of the present invention have conducted further investigations and found that the insulation resistance decreases when the amount of the segregates containing Ni, Ti, and Mn is 1.0 vol % or less of a fired sinter.

In other words, the amount of segregates containing Ni, Ti, and Mn is 1.0 vol % or less (including 0 vol %) of a fired sinter in the pyroelectric ceramic composition of the present invention.

A pyroelectric element of the present invention is a pyroelectric element including a pyroelectric body and electrodes formed on surfaces of the pyroelectric body, in which the pyroelectric body is composed of the pyroelectric ceramic composition described above.

By using the pyroelectric element described above, an infrared detector that has small fluctuation of bias voltage Vs with changes in temperature, achieves stable sensor properties, and exhibit satisfactory pyroelectric properties even after a reflow process can be obtained.

In other words, the infrared detector of the present invention is characterized by including the pyroelectric element described above.

The infrared detector of the present invention can be a surface-mount-type infrared detector that includes the pyroelectric element described above, a package in which the pyroelectric element is accommodated, and an optical filter that transmits infrared radiation of a particular wavelength, in which the package has a shape of a box having an opening at one of the sides and a wiring pattern that electrically connects to the pyroelectric element is provided inside the package, and the optical filter has a function of allowing the pyroelectric element to receive the infrared radiation of the particular wavelength and a function of a lid for sealing the opening, the optical filter being provided to cover the entire opening of the package.

The infrared detector of the present invention is characterized in that no load resistance is provided in parallel to the pyroelectric element.

Advantages

According to the pyroelectric ceramic composition of the present invention, since a compound represented by $(Pb_{1-x}Ca_x)_{(1+a)}\{(Ni_{1/3}Nb_{2/3})_y Ti_{(1-y)}\}O_3$ (wherein x, y, and a satisfy $0.20 \leq x \leq 0.27$, $0.01 \leq y \leq 0.06$, and $0.001 \leq a \leq 0.02$, respectively) is contained as a main component and 0.3 to 2.5 mol of Mn is contained per 100 mol of the main component, the insulation resistance is adequately low, a high Curie temperature Tc (e.g., 260° C. or higher) that can withstand a reflow process can be obtained, and satisfactory pyroelectric properties can be achieved.

In the pyroelectric ceramic composition of the present invention, the amount of segregates containing Ni, Ti, and Mn is 1.0 vol % or less (including 0 vol %) of a fired sinter. Thus, the insulation resistance can be effectively decreased.

Moreover, since the pyroelectric element of the present invention includes a pyroelectric body composed of the pyroelectric ceramic composition described above, a pyroelectric element that has an adequately low insulation resistance and a high Curie temperature Tc while having satisfactory pyroelectric properties can be obtained.

Since the infrared detector of the present invention include the pyroelectric element composed of the pyroelectric ceramic composition described above, the fluctuation of bias voltage Vs with changes in temperature is small and stable sensor properties can be detected.

The infrared detector includes the pyroelectric element described above, a package in which the pyroelectric element is accommodated, and an optical filter transmitting infrared radiation of a particular wavelength; the package has a shape of a box having an opening at one of its surfaces and a wiring pattern that electrically connects to the pyroelectric element is provided inside the package; and the optical filter has a function of allowing the pyroelectric element to receive the infrared radiation of the particular wavelength and a function of a lid for sealing the opening, the optical filter being provided to cover the entire opening of the package. Thus, the advantages described above can be easily achieved.

The infrared detector can achieve stable sensor properties without having a load resistance provided in parallel to the pyroelectric element. Thus, a smaller, shorter, and lower-cost infrared detector design can be achieved. Moreover, since the Curie temperature of the pyroelectric ceramic composition is high, a surface-mount type infrared detector that has satisfactory pyroelectric properties even after a reflow process can be obtained.

REFERENCE NUMERALS

Figure 1:
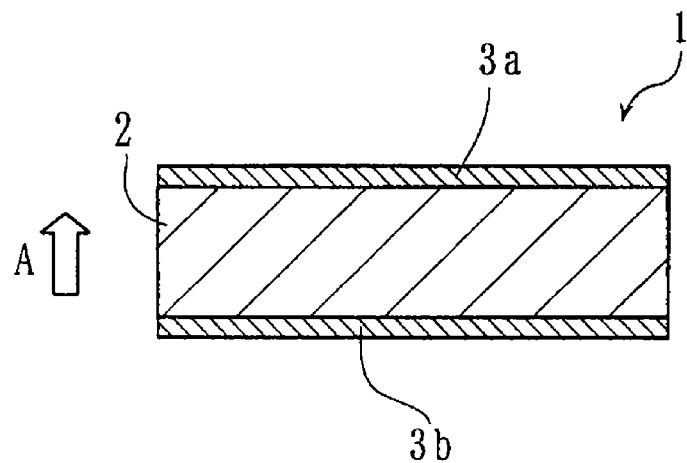
FIG. 1 is a cross-sectional view schematically showing an embodiment of a pyroelectric element of the present invention.

1: pyroelectric element
2: pyroelectric body
4: package
4a: opening
5: optical filter

BEST MODES FOR CARRYING OUT THE INVENTION

Embodiments of the present invention will now be described.

A pyroelectric ceramic composition according to an embodiment of the present invention contains, as a main component, a PNN-PT compound having a perovskite crystal structure (general formula $ABO_3$) and contains 0.3 to 2.5 mol of Mn per 100 mol of the main component.

To be more specific, the main component is represented by general formula (A) below:

$$(Pb_{1-x}Ca_x)_{(1+a)}\{(Ni_{1/3}Nb_{2/3})_y Ti_{(1-y)}\}O_3 \quad (A)$$

In the formula, the molar content ratio x of Ca in the A site, the molar content ratio y of $(Ni_{1/3}Nb_{2/3})$, and the blend molar ratio of the A site component to the B site component satisfy mathematical formulae (1) to (3) below:

$$0.20 \leq x \leq 0.27 \quad (1)$$

$$0.01 \leq y \leq 0.06 \quad (2)$$

$$0.001 \leq a \leq 0.02 \quad (3)$$

Since the pyroelectric ceramic composition has the above-described composition, the amount of segregates containing Ni, Ti, and Mn is 1.0 vol % or less (including 0 vol %) in a fired sinter.

Since the pyroelectric ceramic composition has the above-described composition, the pyroelectric ceramic composition achieves good pyroelectric properties while exhibiting an adequately low insulation resistance and a high Curie temperature Tc that can withstand the reflow process at 260° or higher.

The reasons for limiting the molar content ratio x of Ca in the A site, the molar content ratio y of $(Ni_{1/3}Nb_{2/3})$, the blend molar ratio of the A site component to the B site component, and the Mn content to the above-described ranges will now be described in detail.

(1) Molar Content Ratio x

The relative dielectric constant ∈r and the Curie temperature Tc can be controlled to levels appropriate for infrared detectors by replacing part of Pb constituting the A site component with Ca. However, when the Ca molar content ratio x in the A site is less than 0.20, the sinterability is degraded and a dense sinter is no longer obtained. On the other hand, at a molar content ratio x exceeding 0.27, the Curie temperature Tc decreases to less than 260° C. and a heat resistance sufficient to withstand a reflow process is no longer obtained.

Thus, in this embodiment, the molar content ratio x is adjusted to satisfy $0.20 \leq x \leq 0.27$.

(2) Molar Content Ratio y

The pyroelectric properties can be improved by replacing part of Ti in the B site component with $(Ni_{1/3}Nb_{2/3})$. However, if the molar content ratio y of $(Ni_{1/3}Nb_{2/3})$ is less than 0.01, the $(Ni_{1/3}Nb_{2/3})$ content is too small to achieve pyroelectric properties sufficient for practical application. On the other hand, at a molar content ratio y exceeding 0.06, Ni compounds and Nb compounds which have been dissolved in crystal grains by forming $(Ni_{1/3}Nb_{2/3})$ can no longer remain dissolved and thus precipitate in crystal boundaries. Thus, a dense sinter cannot be obtained.

Thus, in this embodiment, the molar content ratio y is adjusted to satisfy $0.01 \leq y \leq 0.06$.

(3) Blend Molar Ratio a

The insulation resistance can be decreased by adjusting the blend molar ratio a of the A site to the B site so that the A site is contained in excess compared to the stoichiometric composition. Moreover, good pyroelectric properties can be obtained even after a reflow process. However, at a blend molar ratio a less than 0.001, the amount of segregates containing Ni, Ti, and Mn exceeds 1.0 vol % in the fired sinter, and thus the insulation resistance may not be sufficiently decreased. The pyroelectric properties after the reflow process is also degraded. In contrast, at a blend molar ratio a exceeding 0.02, the insulation resistance decreases excessively and this renders polarization treatment difficult.

Thus, in this embodiment, the blend molar ratio a is adjusted to satisfy $0.001 \leq a \leq 0.02$.

(4) Molar Content of Mn

When the molar content of Mn is less than 0.3 mol per 100 mol of the main component, the sinterability is degraded and thus a dense sinter cannot be obtained. When the molar content of Mn is more than 2.5 mol, segregation of Mn that can no longer remain dissolved in crystal grains occurs extensively, resulting in degradation of pyroelectric properties.

Thus, in this embodiment, the Mn molar content is adjusted to 0.3 to 2.5 per 100 mol of the main component.

As described above, according to this pyroelectric ceramic composition, the amount of segregates containing Ni, Ti, and Mn is 1.0 vol % or less (including 0 vol %) of the fired sinter. The insulation resistance can be lowered but not excessively by further reducing the volume content of the segregates to 1.0 vol % or less.

The volume content of the segregates can be controlled by adjusting the composition and the firing temperature.

A pyroelectric element made using the pyroelectric ceramic composition described above will now be described.

FIG. 1 is a schematic cross-sectional view of one embodiment of a pyroelectric element. A pyroelectric element 1 includes a pyroelectric body 2 prepared from the pyroelectric ceramic composition described above and an upper electrode 3a and a lower electrode 3b, respectively, formed on two main surfaces of the pyroelectric body 2. The pyroelectric element 1 is polarized in the arrow A direction.

The pyroelectric element 1 can be fabricated as follows, for example.

Predetermined amounts of a Pb compound such as $Pb_3O_4$, a Ca compound such as $CaCO_3$, a Ni compound such as NiO, a Nb compound such as $Nb_2O_5$, a Ti compound such as $TiO_2$, and a Mn compound such as $MnCO_3$ as ceramic raw materials constituting the main component are weighed. The weighed materials are charged in a ball mill together with water and milling media such as PSZ (partially stabilized zirconia) balls and mixed to conduct wet milling. The resulting mixture is dewatered, dried, and calcined for a predetermined time at a predetermined temperature (e.g., about 800 to 950° C.) to obtain a calcined material.

Then an organic binder, a dispersant, and water are mixed with the calcined material in a ball mill with milling media to again conduct wet milling. The resulting mixture is dewatered, dried, and then pressed to obtain a ceramic compact having a predetermined shape.

The ceramic compact is then heated at, e.g., 400° C. to 600° C., to remove the binder, enclosed in a sealed saggar, and fired at a temperature high enough for adjusting the amount of segregates containing Ni, Ti, and Mn to 1.0 vol % or less (e.g., 1150° C. to 1200° C.) to prepare a sinter. The two main surfaces of the sinter are then polished to form the pyroelectric body 2, and the upper electrode 3a and the lower electrode 3b are respectively formed on the two main surfaces of the pyroelectric body 2 by an appropriate method, such as a thin film-forming method, e.g., a sputtering method or a vacuum deposition method, a plating method, or an electrode paste baking method.

Subsequently, a polarization treatment is conducted by applying a predetermined electrical field in silicone oil heated to a predetermined temperature to make the pyroelectric element 1.

The pyroelectric element 1 prepared as such includes the pyroelectric body 2 composed of the pyroelectric ceramic composition described above. Thus, the amount of segregates containing Ni, Ti, and Mn is 1.0 vol % or less. Accordingly, a pyroelectric element 1 that achieves good pyroelectric properties while exhibiting an adequately low insulation resistance and a high Curie temperature Tc that can withstand the reflow process can be obtained.

When the pyroelectric element 1 is incorporated into an infrared detector, good pyroelectric properties can be maintained even after the reflow process. Thus, the pyroelectric element 1 is suitable for surface mounting.

Figure 2:
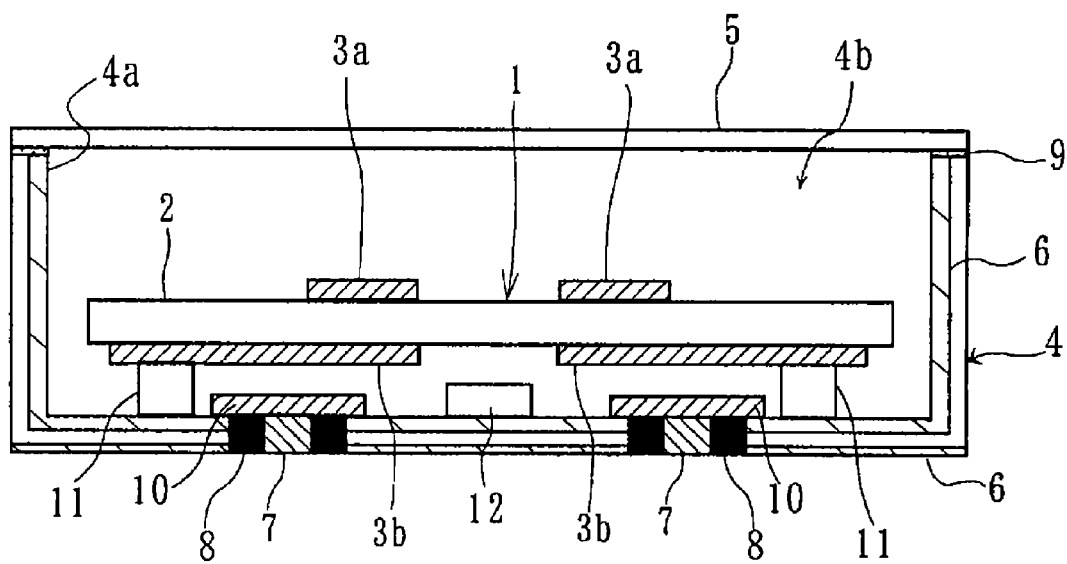
FIG. 2 is a cross-sectional view showing an embodiment of an infrared detector incorporating the pyroelectric element.

FIG. 2 is a cross-sectional view schematically showing one embodiment of an infrared detector incorporating the pyroelectric element 1.

The infrared detector includes a package 4 suitable for surface mounting, in which the pyroelectric element 1 is accommodated, and an optical filter 5 through which infrared radiation of a particular wavelength passes.

In this embodiment, the pyroelectric element 1 is of a dual type. Two upper electrodes (light-receiving electrodes) 3a disposed on a surface of the pyroelectric body 2 are connected in series with reversed polarity so that when infrared radiation enters the upper electrodes 3a simultaneously, the external noise caused by changes in ambient temperature and the like is canceled.

The package 4 has a shape of a box with an opening 4a formed in the upper surface and a hole formed in the bottom surface and is composed of a metal material such as 42Ni, phosphor bronze, brass, a Cu—Ni—Zn alloy, or iron. An insulating member 6 composed of glass, a LCP (liquid crystal polyester) resin, or the like is attached to the inner surface of the package 4. A wiring pattern 10 and a FET 12 are disposed at particular positions on the inner bottom surface of the insulating member 6 so as to electrically connect to electrodes and wiring not shown in the drawing.

Moreover, a supporting member 11 is disposed at an adequate position of the inner bottom surface of the insulating member 6 and the pyroelectric element 1 is disposed on the supporting member 11. In other words, the pyroelectric element 1 is supported by the supporting member 11 through the lower electrode 3b.

An external connecting terminal 7 is provided on the lower surface of the wiring pattern 10 and an insulator 8 such as glass is interposed between the package 4 and the external connecting terminal 7 so as to provide electrical insulation between the package 4 and the external connecting terminal 7. According to this configuration, the pyroelectric element 1 is electrically connected to the wiring pattern disposed in the package 4 and to an external device via the external connecting terminal 7.

The optical filter 5 is disposed at the opening 4a of the package 4. The optical filter 5 has a function of allowing the pyroelectric element 1 to receive infrared radiation of a particular wavelength and functions as a lid for sealing the opening 4a of the package 4.

To be more specific, the optical filter 5 contains, as the filter base material, single crystal silicon that transmits infrared radiation of a particular wavelength. The optical filter 5 is bonded to the package 4 with a conductive adhesive 9 so as to cover the entire opening 4a of the package 4, and by this arrangement, the optical filter 5 is electrically connected to the package 4. Note that in this embodiment, the optical filter 5 is not partially shielded and thus the entire region thereof can transmit the infrared radiation. Accordingly, the infrared radiation-receiving region can be widened, and an infrared detector with high detection accuracy can be obtained.

Figure 3:
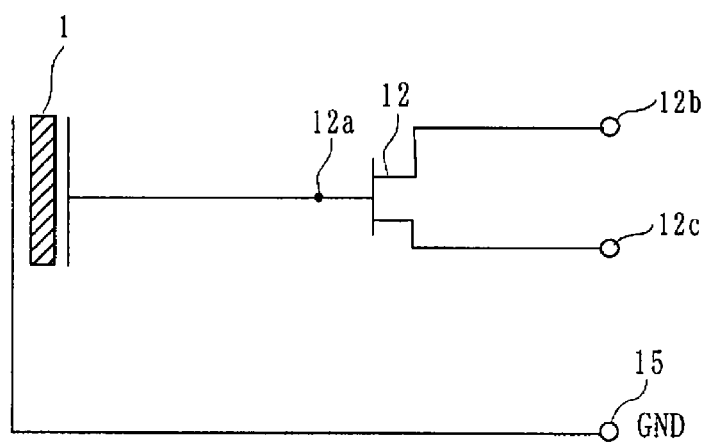
FIG. 3 is a basic circuit diagram of the infrared detector shown in FIG. 2.

FIG. 3 is a basic circuit diagram of the infrared detector shown in FIG. 2.

In the infrared detector, the upper electrode 3a of the pyroelectric element 1 is connected to a ground terminal 15 and the lower electrode 3b is connected to a gate terminal 12a of the FET 12. A supply voltage is applied to a drain terminal 12b of the FET 12 and a source resistor (not shown) is interposed between the source terminal and the ground terminal 15.

In the infrared detector having the above-described structure, when infrared radiation from a subject such as human body enters the upper electrode 3a through the optical filter 5, the magnitude of polarization of the pyroelectric element 1 changes according to the amount of infrared radiation and the pyroelectric element 1 outputs a pyroelectric current having a magnitude proportional to the magnitude of the infrared radiation. Then a voltage signal corresponding to the pyroelectric current is input to the gate terminal 12a. A bias voltage potentially divided by the resistance between the drain terminal 12b and the source terminal 12c and the resistance of the source resistor is superimposed on the voltage signal input to the gate terminal 12a so that a voltage signal is output from the source terminal 12c.

In this embodiment, as described above, since the insulation resistance of the pyroelectric element 1 is low, fluctuation of the bias voltage Vs with changes in temperature can be decreased and stable sensor properties are achieved even when no load resistance is provided in parallel to the pyroelectric element 1. In other words, there is no need to insert a load resistance in parallel to the pyroelectric element 1, thereby saving cost and labor. Moreover, the element internal structure can be simplified and size reduction of the infrared detector can be achieved. Moreover, since the Curie temperature Tc is high, satisfactory pyroelectric properties are maintained even after surface mounting conducted by a reflow process. Accordingly, an infrared detector of a surface mount type having a smaller and thinner pyroelectric element 1 can be realized.

It should be understood that the present invention is not limited to the embodiments described above and is naturally applicable to infrared detectors of a type provided with only one electrode as the pyroelectric element 1 or of a type in which a plurality of pyroelectric elements 1 are connected in series.

The infrared detector of the present invention may include a load resistance. If there is no restriction for size reduction, height reduction, or cost reduction, a load resistance may be provided in parallel to the pyroelectric element 1.

EXAMPLES

Examples of the present invention will now be specifically described.

First, $Pb_3O_4$, $CaCO_3$, NiO, $Nb_2O_5$, $TiO_2$, and $MnCO_3$ were prepared as the ceramic raw materials and weighed to give compositions shown in Table 1. These ceramic raw materials were then charged into a ball mill together with PSZ balls and water and thoroughly wet-mixed. The resulting material mixture was calcined in an atmospheric atmosphere at a temperature of 900° C. for about 4 hours to prepare a calcined material. To the calcined material, 2.5 wt % of an organic binder was added, and the resulting mixture was wet-milled in a ball mill for about 16 hours and dried. The dried calcined material was sized through a 40-mesh sieve, and the resulting powder was press-formed at a pressure of $8.6 \times 10^7$ Pa to obtain a plate-shaped compact 25 mm in length, 40 mm in width and 1.2 mm in thickness.

The plate-shaped compact was placed in an alumina saggar, subjected to binder extraction at a temperature of about 500° C., and fired at 1100° C. to 1200° C. for 2 hours to obtain sinter samples 1 to 29.

The ratio of segregates containing Ni, Ti, and Mn that existed in each of sinter samples 1 to 29 was determined. Each sinter sample was mirror-polished and then irradiated with an electron beam under the processing conditions below by using WDX (wavelength-dispersive X-ray microanalyzer, IXA8800R produced by JEOL Ltd.). On the basis of the X-ray intensity detected, the observed concentration distribution of each sample was image-processed to determine the ratio of segregates containing Ni, Ti, and Mn.

[Processing Conditions]
Acceleration voltage: 15 kV
Irradiation current: 100 nA
Number of pixels: 250×250
Pixel size: 0.3 μm In other words, first, the concentration distribution of Mn was analyzed by studying whether a pixel that showed an X-ray intensity more than or equal to twice the average X-ray intensity of the whole image (among 250×250 pixels) existed or not. If such a pixel was found to exist, it was assumed that the segregates of Mn existed at that position of the image.

Next, the concentration distributions of Ni and Ti were analyzed by studying whether a pixel that showed an X-ray intensity more than or equal to twice the average X-ray intensity of the whole image existed or not at the same coordinate position as the position of the image where the segregates of Mn existed. If such a pixel was found to exist, it was assumed that the segregates of Ni and Ti existed at that position of the image. Thus, the positions where the segregates containing Ni, Ti, and Mn existed were specified.

The area ratio of the amount (number of pixels) of segregates in the whole image (250×250 pixels) was then calculated and the result was assumed to be the ratio (vol %) of the segregates existed.

Next, the sinter was planarized by polishing so that the thickness was about 0.1 mm to make a pyroelectric body, and subjected to sputtering treatment with a Ni—Cu alloy (Ni/Cu=70/30) target so as to prepare an upper electrode and a lower electrode on the two main surfaces, respectively. Subsequently, the pyroelectric body with the upper electrode and the lower electrode was cut into a shape of an element 5 mm in length and 5 mm in width and subjected to a polarization treatment in silicone oil at a temperature of 150° C. for 5 to 30 minutes under an application electrical field of 5 to 12 kV/mm to prepare pyroelectric element samples 1 to 29.

To each sample, 100 V voltage was applied for 30 seconds to measure the insulation resistance and the resistivity $\rho(\Omega \cdot cm)$ and to thereby calculate $\log \rho$.

The capacitance of each sample was determined with an impedance analyzer (HP4294A produced by Agilent Technologies), and the relative dielectric constant $\in r$ was calculated on the basis of the capacitance and the size of the sample.

The temperature characteristic of the relative dielectric constant $\in r$ was measured and the maximal temperature of the relative dielectric constant $\in r$ was calculated and assumed to be the Curie temperature Tc.

In order to subject each sample to a reflow process, each sample was charged into an oven at 260° C. for 5 minutes, and after discharged from the oven, the sample was left to stand for about 12 hours.

Subsequently, each sample was charged in a container in which the temperature could be changed at a particular rate, the temperature was changed in the range of 10° C. to 70° C. at a rate of change in temperature of 0.5° C./s so as to measure the pyroelectric current I (A) and calculate the pyroelectric constant Tp (C/m²·K) on the basis of mathematical formula (4).

$$Tp = I/(S \cdot \Delta t) \qquad (4)$$

where S is the area (m²) of the main surface calculated from the diameter of the sample measured with a micrometer, and $\Delta t$ is a change in temperature per unit time.

Table 1 shows the compositions and the measurement results of Samples 1 to 29.

TABLE 1

| Sample No. | $(Pb_{(1-x)}Ca_x)_{(1+a)}\{(Ni_{1/3}Nb_{2/3})_b Ti_{(1-y)}\}O_3$ | | | Mn content (mol) | Firing temp. (° C.) | Ratio of segregates (vol %) | log ρ (ρ:Ω·cm) | Relative dielectric constant $\in r$ | Curie temp. Tc (° C.) | Pyroelectric constant Tp × $10^{-8}$ (C/cm²·K) |
|---|---|---|---|---|---|---|---|---|---|---|
| | x | y | a | | | | | | | |
| 1* | 0.25 | 0.04 | −0.005 | 1.2 | 1150 | 3.7 | 13.5 | 185 | 284 | 3.01 |
| 2* | 0.25 | 0.04 | 0.000 | 1.2 | 1150 | 2.5 | 12.3 | 196 | 280 | 3.21 |
| 3 | 0.25 | 0.04 | 0.001 | 1.2 | 1150 | 1.0 | 11.8 | 197 | 279 | 4.13 |
| 4 | 0.25 | 0.04 | 0.002 | 1.2 | 1150 | 0.6 | 11.7 | 202 | 278 | 4.45 |
| 5 | 0.25 | 0.04 | 0.005 | 1.2 | 1150 | 0.0 | 11.4 | 205 | 277 | 4.73 |
| 6 | 0.25 | 0.04 | 0.010 | 1.2 | 1150 | 0.0 | 10.9 | 207 | 276 | 4.77 |
| 7 | 0.25 | 0.04 | 0.020 | 1.2 | 1150 | 0.0 | 10.1 | 211 | 275 | 4.80 |
| 8* | 0.25 | 0.04 | 0.025 | 1.2 | 1150 | 0.0 | 9.5 | 216 | 275 | — |
| 9* | 0.15 | 0.04 | 0.005 | 1.2 | 1150 | — | — | — | — | — |
| 10 | 0.20 | 0.04 | 0.005 | 1.2 | 1150 | 0.0 | 11.2 | 161 | 336 | 3.85 |
| 11 | 0.27 | 0.04 | 0.005 | 1.2 | 1150 | 0.0 | 11.5 | 226 | 262 | 4.81 |
| 12* | 0.30 | 0.04 | 0.005 | 1.2 | 1150 | 0.0 | 11.6 | 262 | 238 | 0.12 |
| 13* | 0.32 | 0.04 | 0.005 | 1.2 | 1150 | 0.0 | 11.6 | 288 | 223 | 0.06 |
| 14* | 0.35 | 0.04 | 0.005 | 1.2 | 1150 | 0.0 | 11.6 | 326 | 207 | 0.03 |
| 15* | 0.40 | 0.04 | 0.005 | 1.2 | 1150 | 0.0 | 11.7 | 390 | 183 | 0.03 |
| 16* | 0.45 | 0.04 | 0.005 | 1.2 | 1150 | 0.0 | 11.8 | 459 | 160 | 0.01 |
| 17* | 0.25 | 0.00 | 0.005 | 1.2 | 1150 | 0.3 | 11.9 | 182 | 284 | 2.27 |
| 18 | 0.25 | 0.01 | 0.005 | 1.2 | 1150 | 0.0 | 11.5 | 188 | 282 | 3.94 |
| 19 | 0.25 | 0.06 | 0.005 | 1.2 | 1150 | 0.0 | 10.6 | 220 | 272 | 4.41 |
| 20* | 0.25 | 0.10 | 0.005 | 1.2 | 1150 | — | — | — | — | — |
| 21* | 0.25 | 0.04 | 0.005 | 0.2 | 1150 | — | — | — | — | — |
| 22 | 0.25 | 0.04 | 0.005 | 0.3 | 1150 | 0.0 | 10.3 | 219 | 276 | 3.46 |

TABLE 1-continued

| Sample No. | $(Pb_{(1-x)}Ca_x)_{(1+a)}\{(Ni_{1/3}Nb_{2/3})_yTi_{(1-y)}\}O_3$ | | | Mn content (mol) | Firing temp. (° C.) | Ratio of segregates (vol %) | log ρ (ρ:Ω · cm) | Relative dielectric constant ∈r | Curie temp. Tc (° C.) | Pyroelectric constant Tp × $10^{-8}$ (C/cm² · K) |
|---|---|---|---|---|---|---|---|---|---|---|
| | x | y | a | | | | | | | |
| 23 | 0.25 | 0.04 | 0.005 | 2.5 | 1150 | 0.0 | 10.4 | 212 | 279 | 3.87 |
| 24* | 0.25 | 0.04 | 0.005 | 3.0 | 1150 | — | — | — | — | — |
| 25* | 0.32 | 0.04 | 0.000 | 1.2 | 1150 | 2.9 | 12.5 | 283 | 225 | 0.07 |
| 26* | 0.25 | 0.04 | −0.005 | 1.2 | 1100 | 3.6 | 13.3 | 188 | 284 | 2.96 |
| 27* | 0.25 | 0.04 | −0.005 | 1.2 | 1200 | 3.5 | 13.5 | 185 | 283 | 3.07 |
| 28 | 0.25 | 0.04 | 0.001 | 1.2 | 1175 | 0.5 | 11.5 | 214 | 274 | 4.65 |
| 29 | 0.25 | 0.04 | 0.001 | 1.2 | 1200 | 0.2 | 11.4 | 203 | 275 | 4.77 |

*Asterisked samples are outside the range of the invention.

Samples 1 to 25 were fired at 1150° C.

In Sample 1, the blend molar ratio a of the A site to the B site was −0.005, i.e., the B site was in excess; log ρ was 13.5, which was more than 12.0, and the insulation resistance could not be decreased.

In Sample 2, the blend molar ratio a of the A site to the B site was 0.000, i.e., a stoichiometric ratio; log ρ was 12.3, which was more than 12.0, and the insulation resistance could not be decreased.

In Sample 8, the blend molar ratio a was 0.025, i.e., the A site was excessively in excess; log ρ decreased to 9.5, which was not more than 10.0. Thus, sufficient polarization treatment could not be performed, and the pyroelectric constant Tp could not be measured.

In Sample 9, the molar content ratio x of Ca in the A site was 0.15 and thus a dense sinter could not be obtained at a firing temperature of 1150° C. Thus, it was found that sinterability was degraded.

In Samples 12 to 16, the molar content ratio x of Ca in the A site was 0.30 or more; the Curie temperature Tc decreased to less than 260° C. As a result, it was found that the pyroelectric constant Tp after the reflow process was 0.12 to 0.01×10$^{-8}$ (C/cm²·K), indicating that the pyroelectricity was substantially vanished.

Sample 17 was free of (Ni$_{1/3}$Nb$_{2/3}$); the pyroelectric constant Tp decreased to 2.27×10$^{-8}$ C/cm²·K and a pyroelectric constant Tp sufficient for practical application as the pyroelectric element could not be obtained.

Sample 20 had a molar content ratio y of (Ni$_{1/3}$Nb$_{2/3}$) of 0.10, which was more than 0.06. The NiO and Nb$_2$O$_5$ that could not remain dissolved in the crystal grains in the form of (Ni$_{1/3}$Nb$_{2/3}$) precipitated in the crystal grain boundaries, and a dense sinter could not be obtained at a firing temperature of 1150° C. Thus, it was found that sinterability was degraded.

Sample 21 had a low Mn molar content of 0.2 mol per 100 mol of the main component; a dense sinter could not be obtained at a firing temperature of 1150° C. Thus, it was found that sinterability was degraded.

Sample 24 had an excess Mn molar content of 3.0 mol per 100 mol of the main component; Mn was difficult to remain dissolved in the crystal grains and significantly segregated in the crystal boundaries. As a result, pyroelectricity was degraded and the polarization treatment became difficult.

Sample 25 had a molar content ratio x of 0.32, which was more than 0.27 and a blend molar ratio a of 0.000, which was less than 0.001. The Curie temperature Tc decreased to 225° C. and the pyroelectric constant Tp became 0.07 after the reflow process, thereby substantially losing the pyroelectricity.

In contrast, Samples 3 to 7, 10, 11, 18, 19, 22 and 23 had x, y, a, and Mn molar content within the ranges of the present invention, and the ratio of the segregates that exist in the sinter was 1.0 vol % or less. Log ρ was 10.1 to 11.8 and the insulation resistance was adequately decreased. Moreover, the pyroelectric constant Tp was 3.46 to 4.81×10$^{-8}$C/cm²·K so that satisfactory pyroelectric properties was maintained. Moreover, a Curie temperature Tc of 260° C. or higher could be maintained. The relative dielectric constant ∈r was 161 to 226, indicating that an adequate value could be maintained.

Samples 26 and 27 had the same composition as Sample 1 but their firing temperatures were 1100° C. and 1200° C., respectively. In Samples 26 and 27, a dense sinter was obtained as in Sample 1, but the ratio of the segregates containing Ni, Ti, and Mn in the sinter could not be reduced to 3.5% or less and log ρ was as high as 12.0 or more.

In contrast, Samples 28 and 29 had the same composition as Sample 3 but their firing temperatures were 1,175° C. and 1200° C., respectively. In this case, the ratio of the segregates containing Ni, Ti, and Mn in the sinter could be reduced to less than 1.0 vol % by raising the firing temperature and log ρ was also decreased to 11.5 and 11.4.

As described above, it was found that at a blend molar ratio a of less than 0.001 mol, the ratio of the segregates containing Ni, Ti, and Mn in the sinter could not be reduced to 1.0 vol % or less and log ρ could not be reduced to 12.0 or less even when the firing temperature was raised.

In contrast, it was found that when the blend molar ratio a was 0.001 to 0.020, the amount of segregates containing Ni, Ti, and Mn in the sinter was 1.0 vol % or less and log ρ decreased to 12.0 or less. With respect to the firing temperature, it was found that as the firing temperature increased, volume content of the segregates could be reduced, and that the insulation resistance decreased with the volume content of the segregates.

Next, pyroelectric elements of Sample 2, which was in the range of the present invention, and Sample 3, which was outside the range of the present invention, were installed in infrared detectors shown in FIG. 2, and the temperature was changed in the range of −25° C. to 60° C. for one reciprocal cycle at a rate of 1° C./min to measure the fluctuation of bias voltage Vs from the source terminal.

Figure 4:
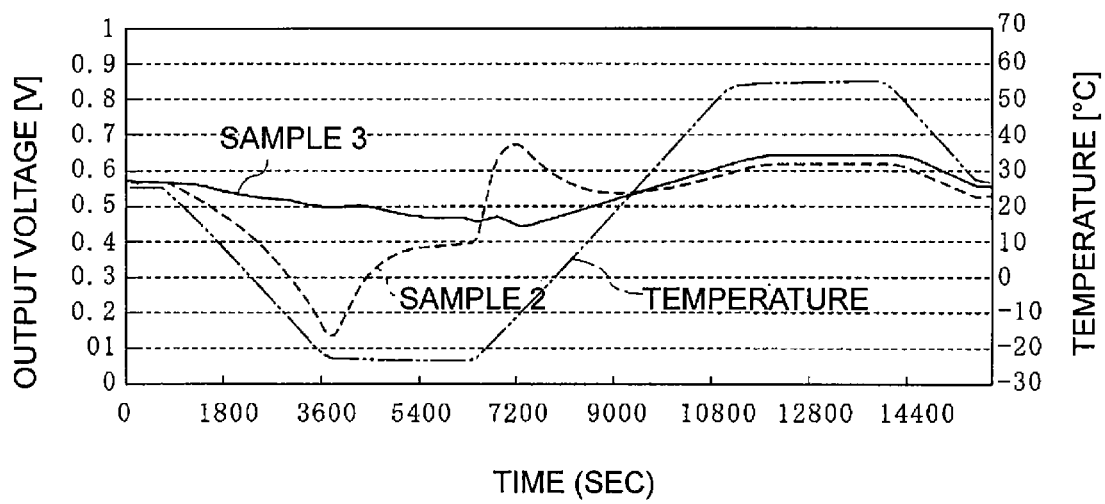
FIG. 4 is a graph showing changes in source voltage over time along with changes in temperature for Samples 2 and 3.
Figure 5:
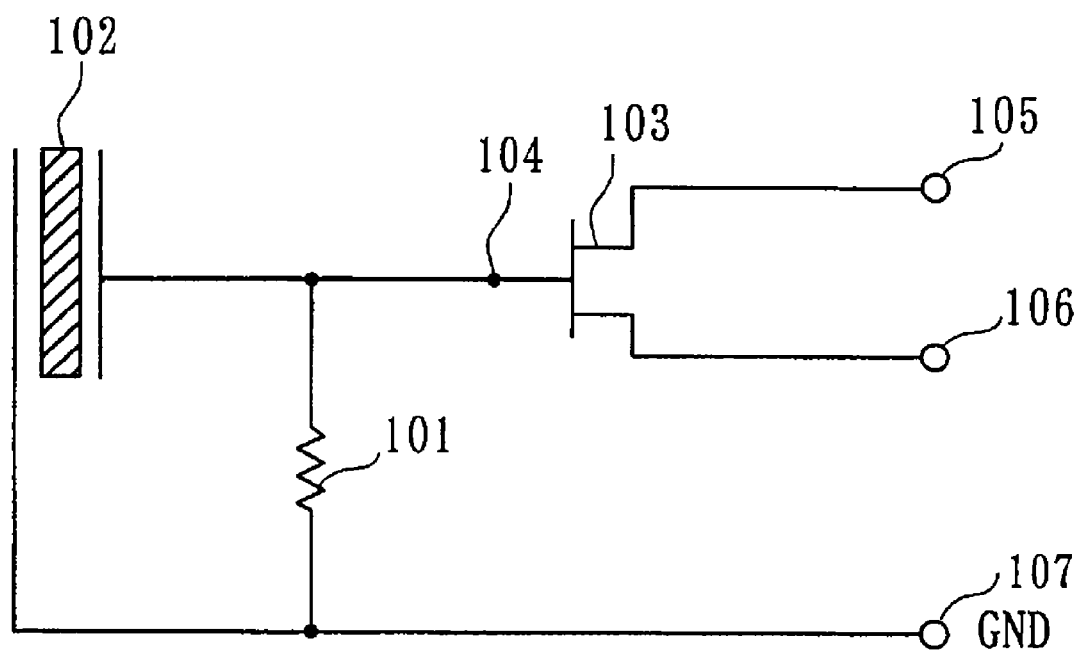
FIG. 5 is a basic circuit diagram of a conventional infrared detector.

FIG. 4 is a graph showing the change in output voltage over time along with the changes in temperature, in which Sample 3 is indicated by a solid line, Sample 2 is indicated by a broken line, and the temperature is indicated by a two-dot chain line.

FIG. 4 clearly shows that the insulation resistance of the pyroelectric element of Sample 2 outside the range of the present invention was high (log ρ: 12.3), and thus the bias voltage Vs showed notable fluctuations along with the changes in temperature.

In contrast, the insulation resistance of the pyroelectric element of Sample 3 within the range of the present invention had a low insulation resistance (log ρ: 11.8) and thus the fluctuation of the bias voltage Vs with the changes in temperature was suppressed.

The invention claimed is:

1. A pyroelectric ceramic composition comprising a compound represented by $(Pb_{1-x}Ca_x)_{(1+a)}\{(Ni_{1/3}Nb_{2/3})_y Ti_{(1-y)}\}O_3$ wherein x, y, and a satisfy $0.20 \leq x \leq 0.27$, $0.01 \leq y \leq 0.06$, and $0.001 \leq a \leq 0.02$, respectively, as a main component and 0.3 to 2.5 mol of Mn per 100 mol of the main component.

2. The pyroelectric ceramic composition according to claim 1, having a composition which, when sintered, has an amount of segregates containing Ni, Ti, and Mn of 1.0 vol % or less.

3. The pyroelectric ceramic composition according to claim 2, having an amount of segregates containing Ni, Ti, and Mn of 0.6 vol % or less.

4. The pyroelectric ceramic composition according to claim 3, wherein $0.25 \leq x \leq 0.27$, $0.04 \leq y \leq 0.06$, and $0.002 \leq a \leq 0.005$, respectively, and the amount of Mn per 100 mol of the main component is 1.2 to 2.5 mol.

5. The pyroelectric ceramic composition according to claim 2, wherein $0.25 \leq x \leq 0.27$, $0.04 \leq y \leq 0.06$, and $0.002 \leq a \leq 0.005$, respectively, and the amount of Mn per 100 mol of the main component is 1.2 to 2.5 mol.

6. A pyroelectric element comprising a pyroelectric body and electrodes respectively on two surfaces of the pyroelectric body, wherein the pyroelectric body is composed of the pyroelectric ceramic composition according to claim 5.

7. An infrared detector comprising the pyroelectric element according to claim 6.

8. A pyroelectric element comprising a pyroelectric body and electrodes respectively on two surfaces of the pyroelectric body, wherein the pyroelectric body is composed of the pyroelectric ceramic composition according to claim 2.

9. An infrared detector comprising the pyroelectric element according to claim 8.

10. A surface-mount-type infrared detector comprising the pyroelectric element of claim 8, a package having a plurality of surfaces and in which the pyroelectric element is accommodated, and an optical filter that transmits infrared radiation of a particular wavelength, wherein the package has a shape of a box having an opening in one of its surfaces and a wiring pattern that electrically connects to the pyroelectric element disposed inside the package, and the optical filter is disposed to allow the pyroelectric element to receive the infrared radiation of the particular wavelength and function as a lid for sealing the opening, the optical filter being provided to cover the entire opening of the package.

11. The infrared detector according to claim 10, which is devoid of a load resistance in parallel to the pyroelectric element.

12. The infrared detector according to claim 10, having a load resistance in parallel to the pyroelectric element.

13. The pyroelectric ceramic composition according to claim 1, wherein $0.25 \leq x \leq 0.27$, $0.04 \leq y \leq 0.06$, and $0.002 \leq a \leq 0.005$, respectively, and the amount of Mn per 100 mol of the main component is 1.2 to 2.5 mol.

14. A pyroelectric element comprising a pyroelectric body and electrodes respectively on two surfaces of the pyroelectric body, wherein the pyroelectric body is composed of the pyroelectric ceramic composition according to claim 13.

15. An infrared detector comprising the pyroelectric element according to claim 14.

16. A pyroelectric element comprising a pyroelectric body and electrodes respectively on two surfaces of the pyroelectric body, wherein the pyroelectric body is composed of the pyroelectric ceramic composition according to claim 1.

17. An infrared detector comprising the pyroelectric element according to claim 16.

18. A surface-mount-type infrared detector comprising the pyroelectric element of claim 16, a package having a plurality of surfaces and in which the pyroelectric element is accommodated, and an optical filter that transmits infrared radiation of a particular wavelength, wherein the package has a shape of a box having an opening in one of its surfaces and a wiring pattern that electrically connects to the pyroelectric element disposed inside the package, and the optical filter is disposed to allow the pyroelectric element to receive the infrared radiation of the particular wavelength and function as a lid for sealing the opening, the optical filter being provided to cover the entire opening of the package.

19. The infrared detector according to claim 18, which is devoid of a load resistance in parallel to the pyroelectric element.

20. The infrared detector according to claim 18, having a load resistance in parallel to the pyroelectric element.

* * * * *